United States Patent
Lueders et al.

(10) Patent No.: US 8,283,963 B2
(45) Date of Patent: Oct. 9, 2012

(54) OUTPUT STAGE HAVING ZENER VOLTAGE BALANCING

(75) Inventors: Uwe Lueders, Kusterdingen-Jettenburg (DE); Juergen Eckhardt, Markgroeningen (DE); Bernd Mueller, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 273 days.

(21) Appl. No.: 11/919,623

(22) PCT Filed: Mar. 31, 2006

(86) PCT No.: PCT/EP2006/061230
§ 371 (c)(1),
(2), (4) Date: Oct. 28, 2009

(87) PCT Pub. No.: WO2006/114363
PCT Pub. Date: Nov. 2, 2006

(65) Prior Publication Data
US 2010/0033230 A1  Feb. 11, 2010

(30) Foreign Application Priority Data
Apr. 28, 2005 (DE) .......................... 10 2005 019 709

(51) Int. Cl.
*H03K 5/08* (2006.01)
(52) U.S. Cl. ........ 327/318; 327/319; 327/320; 327/324; 361/56
(58) Field of Classification Search .......... 327/318–320, 327/324; 361/56
See application file for complete search history.

(56) References Cited

U.S. PATENT DOCUMENTS

| | | | |
|---|---|---|---|
| 4,684,876 A * | 8/1987 | Creel | 323/268 |
| 5,811,947 A * | 9/1998 | Hurst et al. | 318/370 |
| 5,909,108 A | 6/1999 | He et al. | |
| 6,222,709 B1 * | 4/2001 | Baba | 361/18 |
| 6,342,780 B1 * | 1/2002 | Pickering | 323/313 |
| 6,493,204 B1 * | 12/2002 | Glidden et al. | 361/187 |
| 6,577,172 B2 * | 6/2003 | Torres | 327/110 |
| 6,614,077 B2 * | 9/2003 | Nakamura et al. | 257/355 |
| 6,625,522 B2 * | 9/2003 | Sakurai et al. | 701/1 |
| 7,015,681 B2 * | 3/2006 | Thiery | 323/276 |
| 7,167,384 B2 * | 1/2007 | Yasumura | 363/127 |
| 7,221,127 B2 * | 5/2007 | Masson et al. | 322/28 |
| 7,349,193 B2 * | 3/2008 | Cheever, Jr. | 361/155 |
| 7,453,308 B2 * | 11/2008 | Tihanyi | 327/309 |

FOREIGN PATENT DOCUMENTS

| | | |
|---|---|---|
| DE | 101 57 250 | 12/2002 |
| EP | 0 600 229 | 6/1994 |
| EP | 0 881 682 | 12/1998 |
| JP | 6-132739 | 5/1994 |
| JP | 6-196706 | 7/1994 |
| JP | 11-27067 | 1/1999 |

* cited by examiner

OTHER PUBLICATIONS

Anonymous, "Parallel output drivers for inductive load", Research Disclosure, Mason Publications, Hampshire, GB Bd. 438, Nr., Oct. 22, 2000.

*Primary Examiner* — Kenneth B. Wells
(74) *Attorney, Agent, or Firm* — Kenyon & Kenyon LLP

(57) ABSTRACT

An output stage, especially a switching output stage for switching inductive loads, having a plurality of individual output stages that are connected in parallel, which include degenerative transistors, in the degenerative path of which one respective Zener diode is present. The electric power during a switching-off process can be distributed in a particularly uniform manner to the individual output stages or transistors by disposing the Zener diodes near the associated transistors so that they are thermally coupled to the respectively associated transistor and their Zener voltage increases with increasing temperature.

15 Claims, 2 Drawing Sheets

OUTPUT STAGE HAVING ZENER VOLTAGE BALANCING

FIELD OF THE INVENTION

The present invention relates to an output stage or a switching output stage for switching inductive loads, using at least two individual output stages connected in parallel.

BACKGROUND INFORMATION

Modern vehicles are furnished with a plurality of relays, valves and other components which, with regard to their electrical properties, represent ohmic inductive loads. In order to switch these elements, so-called switching output stages are provided, whose transistors are designed in different sizes, depending on the power to be switched. The transistors are connected in inverse feedback voltage (as diodes), a component being connected in the degenerative feedback path which determines the Zener voltage of the transistors. The transistors act as Zener diodes that drain off the interrupting current when the inductive load is switched off.

To increase the switching capacity, the switching output stages can be connected, in principle, in any parallel manner. The admissible switching current is then yielded by the sum of the individual switching currents of the switching output stages connected in parallel. Upon switching off, the breaking energy and the breaking power do not, however, increase corresponding to the expected values, because of the parallel connections. Thus, one does not obtain the sum of the individual breaking energies of the individual output stages that are connected in parallel.

This applies in an especially extreme manner to a parallel connection of switching output stages and output stages having different breaking power or different Zener voltage, which, for example, can also occur in a tolerance-conditioned manner. It is true that, in such circuits, the admissible switching current and the admissible switching power can be increased, but not so for the admissible breaking power and breaking energy. Rather, the admissible breaking energy is only of the order of magnitude of the weakest output stage. Because of this fact, the range of use of the output stages is severely restricted, and, these days, for the switching of ohmic inductive loads, only output stages and output stage transistors of the same power class are connected in parallel.

However, even in the case of the parallel connection of output stages of the same power class, problems may arise that are conditioned upon tolerances, because output stages and output stage components used these days have manufacturing-conditioned tolerances in the Zener voltage of ±1.5 Volt at a Zener voltage specified to be the same, on a monolithically integrated output stage chip.

Integrated output stage components include, at this time, up to 18 individual output stages that are designed for switching different switching currents. It is an object of the present invention, in a breaking procedure, to reduce the load of individual transistors of the individual output stages or individual switching output stages, connected in parallel, and to effect as uniform as possible a current distribution to all transistors of the individual output stages, and thus to achieve that the sum of the breaking energy is essentially equivalent to the sum of the individual breaking energies.

SUMMARY OF THE INVENTION

This object is achieved according to the features of the present invention, which have the effect of balancing the output stage extinction voltage.

The output stage or switching output stage for switching inductive loads, having at least two individual output stages connected in parallel, has the advantage that any individual output stages, even those of different power classes, can be connected in parallel, without having to accept the limitation of a reduced breaking energy. This advantage is achieved in that a balancing of the output stage Zener voltage takes place. During the balancing, the Zener voltage has to increase under load and/or temperature; in this context, that is, it must have a positive load coefficient and/or temperature coefficient. In such a case, the Zener voltage rises so high that it reaches the height of the Zener voltage of the output stage connected in parallel, and consequently, this individual output stage will also take over breaking energy.

In a particularly advantageous manner, the Zener diode, that is present anyway, or even a Zener cascade that is present can be used, and can be integrated into the output stage area of the chip. Since Zener diodes used in output stages, having the required Zener voltages, usually have a positive temperature effect in any case, the Zener voltage rises automatically in response to the transistors becoming hotter. This can be utilized, according to the present invention, by a corresponding spatial assignment of a Zener diode and a transistor or switching transistor.

One important aspect of the present invention is to position the components present in the degenerative feedback path of the switching transistors, for instance, Zener diodes, in or near the semiconductor structure of the switching transistors, so that they are thermally coupled to the transistors. This has the following effect: If a large current flows through one of the transistors, it becomes hot and thereby also heats the Zener diode. In the case of components having a positive temperature coefficient (that is, the resistance, or rather, in the case of Zener diodes, the breakdown threshold rises at an increasing temperature), the Zener voltage of the output stage also rises because of it. When the Zener voltage reaches the level of another output voltage which has not yet gone over into the Zener operation, the other output stage can consequently also take over breaking energy, whereby it becomes hot in turn, etc. Because of the thermal coupling of the Zener diodes to the switching transistors, it is therefore possible quickly to adapt the Zener voltages of the individual transistor stages to one another and thereby to distribute the breaking energy uniformly to all the transistors of the switching output stage, without overloading individual transistors.

In the case of components situated in the degenerative feedback path or components present anyway, Zener diodes are preferably involved or thermal resistors.

Components are preferably selected that have a very high temperature coefficient, especially an exponential temperature coefficient. Because of this, the Zener voltages become more like one another especially rapidly.

In an advantageous manner, the present invention can be extended to the parallel connection of a plurality of individual output stages, one transistor after another, or rather, one output stage after another then taking over breaking energy based on the Zener voltage rising because of heating up.

DETAILED DESCRIPTION

Figure 1:
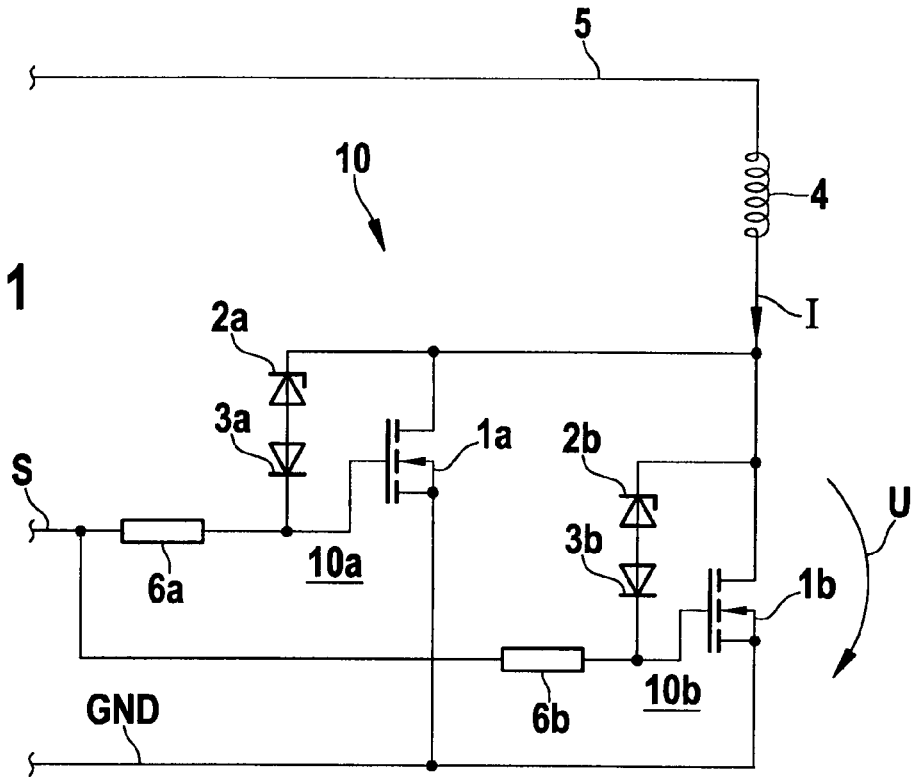
FIG. 1 shows a schematic basic circuit diagram of the output stages having parallel connection of two output stages.

In an exemplary way, FIG. 1 shows a schematic basic circuit diagram of an output stage having a parallel connection of two individual output stages which are particularly implemented as an IC. Each of the output stages includes a switching transistor and an associated diode device. The parallel connection 10 of the two individual output stages 10a, 10b includes parallel-connected transistors 1a and 1b. In the degenerative feedback path of transistors 1a and 1b, a diode arrangement 2a, 3a and 2b, 3b is present which lies between the gate and a drain of transistor 1a and 1b. Diode arrangement 2a, 3a and 2b, 3b in each case includes a Zener diode 2a, 2b connected in the reverse direction and a diode 3a and 3b connected in the flow direction.

Transistors 1a, 1b are controlled by a control device, not shown, using a control signal S, in order to switch ohmic inductive load 4. The supply of signal S takes place via resistors 6a and 6b. In the switched-on state, current I that flows through load 4 is distributed as a function of resistance to transistors 1a, 1b of individual output stages 10a and 10b.

When ohmic inductive load 4 is switched off, the stored magnetic energy of the load must be discharged if high voltages appear at transistors 1a, 1b, whereby Zener diodes 2a, 2b break through in the reverse direction. In the process, transistors 1a, 1b go over into Zener operation, that is, they themselves act as Zener diodes and conduct the current towards ground GND, whereupon the entire electrical output in transistors 1a, 1b is converted into heat.

Zener diodes 2a, 2b of a parallel connection 10 of two (switching) output stages are usually designed to be identical. Based on diffusion differences, material differences, temperature drifts, etc., the Zener voltages, that is, the voltages at which the respective Zener diode 2a, 2b breaks through, may deviate considerably from one another. In the shut-off phases, that Zener diode 2a or 2b, which has the lowest Zener voltage, then breaks down first. This leads to a considerable load on the associated transistor 1a or 1b, which at least for a short period has to take up the entire electrical output until the next transistor goes over into Zener operation. First transistor 1a or 1b may be damaged or destroyed thereby.

Figure 2:
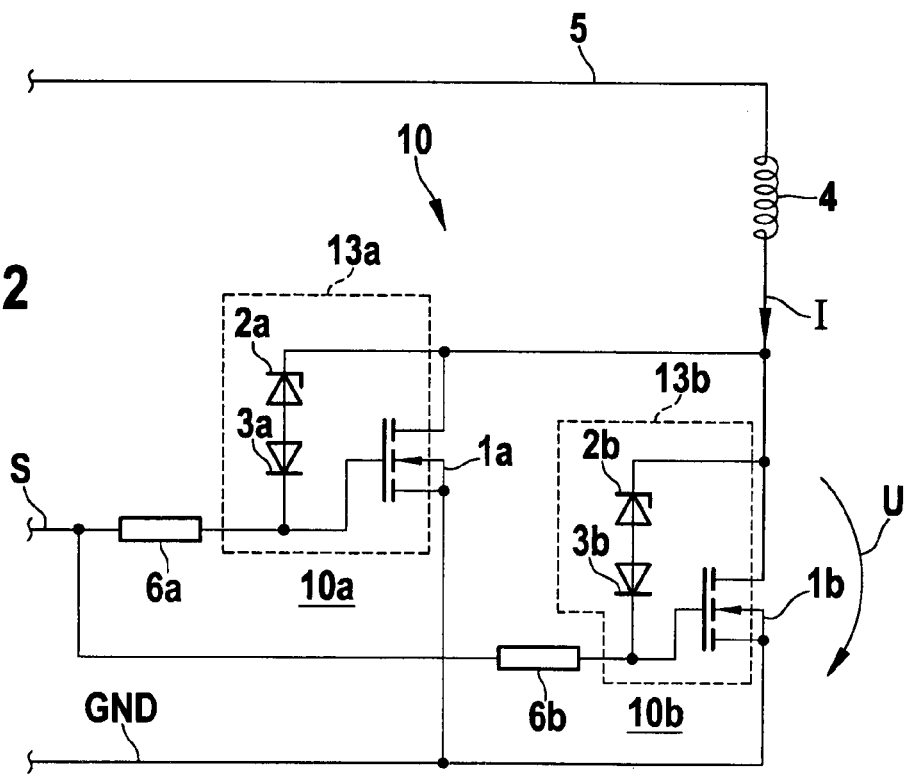
FIG. 2 shows an output stage or switching output stage at parallel connection of two output stages according to one specific embodiment of the present invention.

FIG. 2 shows a parallel circuit 10 of two (switching) output stages which are constructed essentially identically, as in the example in FIG. 1. We refer to the description of FIG. 1 with regard to the explanation of the identical elements. By contrast to the circuit as in FIG. 1, Zener diodes 2a and 2b are coupled thermally to associated switching transistors 1a and 1b, for example MOSFET's. Zener diodes 2a, 2b are situated close to the associated transistor 1a, 1b, or are components of a corresponding transistor stage or of a chip. The thermal coupling is indicated in FIG. 2 by dashed-line regions 13a and 13b.

In response to switching off inductive or ohmic inductive load 4, that is, when control signal S switches to low, the stored magnetic energy and the breaking energy of the load have to be discharged. To do this, the switching transistor of the output stage used is used as a Zener element. In response to a plurality of output stages connected in parallel, the output stage having the lower Zener voltage, for instance, the output stage having switching transistor 1a and diodes 2a and 3a, goes over into Zener operation first, in this context. The other transistor 1b is then still in the reverse state, so that transistor 1a has to take up, for a short period of time, the entire power loss and breaking energy. Based on the thermal coupling of Zener diode 2a and switching transistor 1a, Zener diode 2a heats up very fast, its Zener voltage rising. Because of this, the Zener voltage of first transistor stage 1a, 2a, 3a rises. When the Zener voltage of second transistor stage 1b, 2b, 3b has been reached, it takes over a part of the breaking energy. Since the adjustment of the Zener voltages of the transistor stages takes place relatively fast, the transistor stage breaking through first is not overloaded, and a balancing of the Zener voltage takes place.

Figure 3:
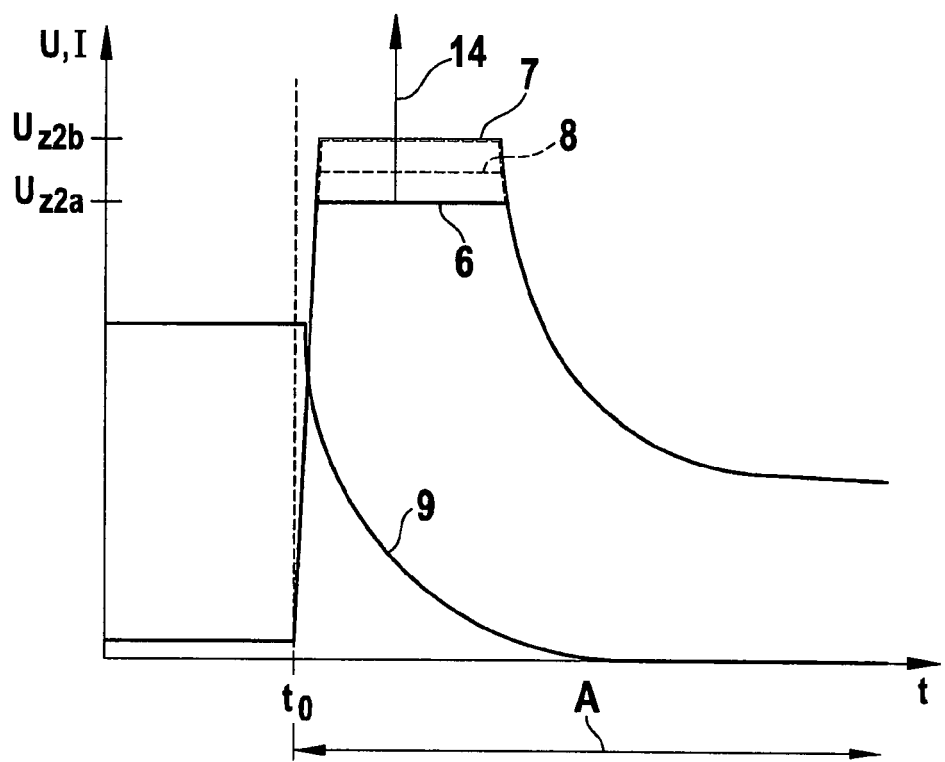
FIG. 3 shows the current curve and the voltage curve at the transistors of the output stage circuit according to the present invention.

FIG. 3 shows the current curve and the voltage curve at transistors 1a and 1b having different Zener voltages (drain-gate voltage) during a breaking procedure; the associated range is designated by A in FIG. 3. Reference numeral 9 designates the current curve I and reference numerals 6 and 7 designate the voltage curves at the two transistors 1a and 1b connected in parallel at a different Zener voltage. Examples of different Zener voltages at equal temperature of the two Zener diodes 2a and 2b are entered as $U_{Z2a}$ and $U_{Z2b}$.

In the present example according to FIGS. 2 and 3, inductive load 4 is switched off at time $t_0$, whereby current I falls off exponentially towards zero. Voltage U increases abruptly, until Zener voltage $U_{Z1a}$ has been reached, and breaks through the Zener diode (in this example with $U_{Z2a} < U_{Z2b}$, that is, Zener diode 2a).

The associated output stage then conducts current I away towards ground GND. In the process, transistor 1a heats up, and thus also Zener diode 2a, whereby its Zener voltage $U_{Z2a}$ rises. The increase with increasing temperature is shown by the direction of arrow 14. The higher Zener voltage $U_{Z2a'}$ is indicated, in this instance, by a dashed line 8. If Zener voltage $U_{Z2a'}$ attains the value $U_{Z2a}$, the next output stage connected in parallel can also take over the breaking energy.

This procedure, which corresponds to a balancing of the output Zener voltage, is possible if the Zener voltage under load and/or temperature increases, that is, if it has a positive load coefficient and/or temperature coefficient. With that, one can achieve a positive Zener voltage development in the parallel connection of a plurality of output stages.

Figure 4:
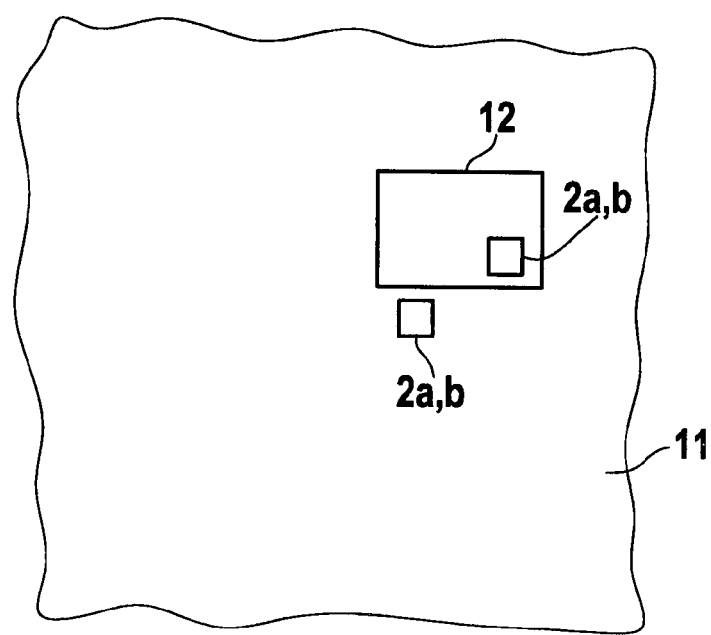
FIG. 4 shows a cutout of a semiconductor chip having an output stage or a switching output stage according to the present invention.

FIG. 4 shows a top view of a planar semiconductor chip 11, of silicon, for instance, having a transistor structure which is shown here schematically as an area 12, and which corresponds, for instance, to switching transistor 1a of output stage 10a. Associated Zener diode 2a, which is present in any case, may be situated within this area or near area 12, and can be especially integrated into the output surface, and it is thus coupled thermally as well as possible to the switching transistor.

If Zener diode 2a has a low Zener voltage $U_Z$, associated transistor 1a will heat up relatively swiftly in response to a breaking procedure, since it carries a large part of the electrical power that is to be discharged as breaking current and converts it to heat. In this process, Zener diode 2a heats up to the same degree, whereby Zener voltage $U_Z$ increases. As soon as Zener voltage $U_{Z2a}$ is at the same level as Zener voltage $U_{Z2b}$, the other switching transistor (not shown) also takes over a part of the electrical energy that is to be discharged. The entire electric power or electric energy that has to be managed when switching off an ohmic inductive load can thus be uniformly distributed to several transistors 1a, 1b or several output stages 10a, 10b connected in parallel.

Instead of Zener diodes 2a and 2b, for example, a thermal resistor having a positive temperature coefficient or another type of suitable component having a positive temperature coefficient can also be used.

LIST OF REFERENCE SYMBOLS 1 transistors
2a, 2b Zener diodes
3a, 3b diodes
4 inductive load
5 exciter circuit
6,7 voltage curves
8 voltage curve at higher temperature
9 current curve
10 switching output stage
11 chip
12 transistor structure
13 thermal coupling
14 increase in the Zener voltage
$t_0$ breaking time
$U_{Z2}$ Zener voltage

What is claimed is:

1. A switching output circuit for switching inductive or ohmic inductive loads, comprising:
a plurality of output stages connected in parallel, each output stage having at least one Zener diode having a Zener voltage, and a switching transistor,
wherein the at least one Zener diode in a first output stage is situated in or at such a proximity to the switching transistor of the first output stage that heat generated by a current going through the switching transistor of the first output stage increases the Zener voltage of the at least one Zener diode in the first output stage, and wherein the Zener voltage of the at least one Zener diode in the first output stage is increased to a same level of the Zener voltage of the at least one Zener diode in a second output stage to cause the at least one Zener diode in the second output stage to conduct a current.

2. The switching output circuit according to claim 1, wherein the at least one component has a positive temperature coefficient.

3. The switching output circuit according to claim 1, wherein the at least one component has an exponential temperature coefficient.

4. The switching output circuit according to claim 1, wherein the at least one component includes at least one of a Zener diode and a thermal resistor, leading to a positive-natured Zener voltage development.

5. The switching output circuit according to claim 1, wherein the Zener voltage of the output stages increase under a change of load and/or temperature.

6. The switching output circuit according to claim 1, wherein a breaking energy that is to be discharged during switching off is distributed to the plurality of output stages.

7. The switching output circuit of claim 1, wherein different Zener diodes have different Zener voltages.

8. The switching output circuit according to claim 1, wherein the at least one Zener diode in the first output stage has a positive temperature coefficient.

9. The switching output circuit according to claim 8, wherein the plurality of output stages connected in parallel belong to different power classes, and wherein the Zener voltage of the output stages increase under a change of load and/or temperature.

10. The switching output circuit according to claim 1, wherein the at least one Zener diode in the first output stage has an exponential temperature coefficient.

11. The switching output circuit according to claim 10, wherein the plurality of output stages connected in parallel belong to different power classes, and wherein the Zener voltage of the output stages increase under a change of load and/or temperature.

12. The switching output circuit according to claim 1, wherein the plurality of output stages connected in parallel belong to different power classes, and wherein the Zener voltage of the output stages increase a change of under load and/or temperature.

13. The switching output circuit according to claim 12, wherein a breaking energy that is to be discharged during switching off is distributed to the plurality of output stages, and wherein the at least one Zener diode of the output stage has a lowest Zener voltage among the plurality of output stages and increases the lowest Zener voltage to a level of a second lowest Zener voltage of a second at least one Zener diode in a second output stage to cause the second Zener diode into Zener operation.

14. The switching output circuit according to claim 1, wherein a breaking energy that is to be discharged during switching off is distributed to the plurality of output stages, and wherein the at least one Zener diode of the output stage has a lowest Zener voltage among the plurality of output stages and increases the lowest Zener voltage to a level of a second lowest Zener voltage of a second at least one Zener diode in a second output stage to cause the second Zener diode into Zener operation.

15. The switching circuit according to claim 1, wherein the at least one Zener diode in each output stage is coupled between a gate and a drain of switching transistor of the each output stage.

* * * * *